United States Patent
Allen et al.

(12)

(10) Patent No.: US 6,296,710 B1
(45) Date of Patent: Oct. 2, 2001

(54) MULTI-PORT GAS INJECTOR FOR A VERTICAL FURNACE USED IN SEMICONDUCTOR PROCESSING

(75) Inventors: Michael B. Allen; Richard A. Anundson; William A. Whigham, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/413,041

(22) Filed: Oct. 6, 1999

(51) Int. Cl.[7] .................................................. C23C 16/00
(52) U.S. Cl. ............................................................. 118/715
(58) Field of Search ............................................... 118/715

(56) References Cited

U.S. PATENT DOCUMENTS

| | | | |
|---|---|---|---|
| 4,062,318 | * 12/1977 | Ban | 118/715 |
| 5,273,586 | * 12/1993 | Kim | 118/715 |

FOREIGN PATENT DOCUMENTS 2-138473 * 5/1990 (JP) ..................................... 118/715

* cited by examiner

*Primary Examiner*—Richard Bueker
(74) *Attorney, Agent, or Firm*—Kevin L. Daffer; Conley, Rose & Tayon P.C.

(57) ABSTRACT

A multi-port gas injector for a vertical furnace that is utilized for low-pressure chemical vapor deposition of silicon dioxide using a tetraethyl orthosilicate ("TEOS") source is provided. The multi-port gas injector has two or three ports for introducing TEOS into the vertical furnace. The gas injector includes a first and second section of tubing, preferably made of quartz, joined such that they are preferably substantially perpendicular. One end of the second section forms one of the ports. In one embodiment a hole located at the position where the first and second sections are joined forms a second port. In other embodiments, a third and, possibly, a fourth section of tubing are joined to the second section of tubing to form a second and, possibly, a third port. Additionally, the second section of tubing may have one or more tapers to reduce the diameter of the hole through which gas exits.

29 Claims, 5 Drawing Sheets

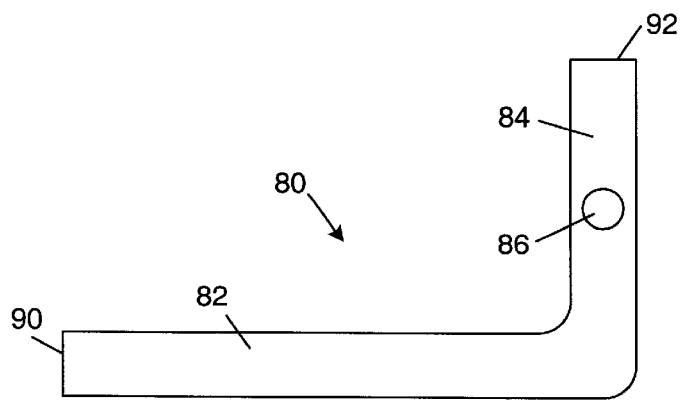
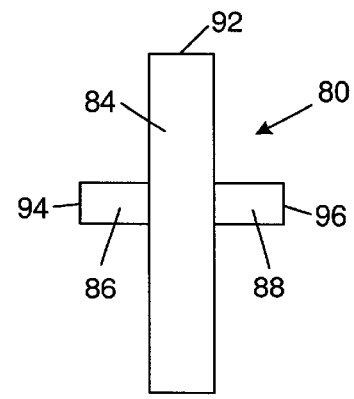
Fig. 6(a)   Fig. 6(b)
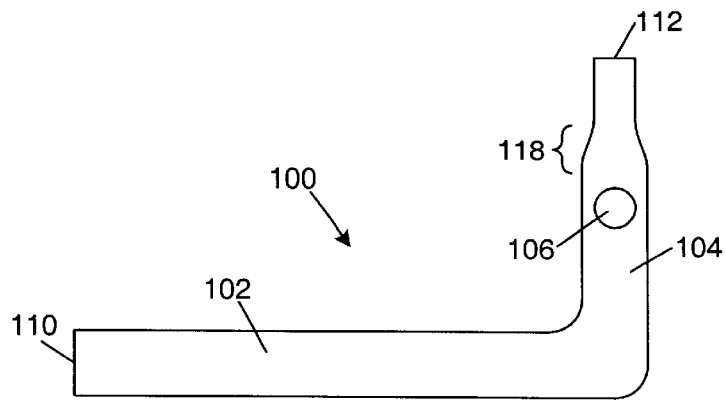
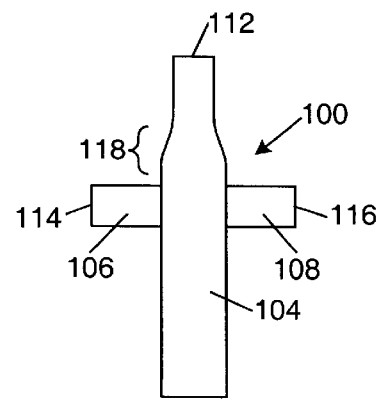
Fig. 7(a)   Fig. 7(b)

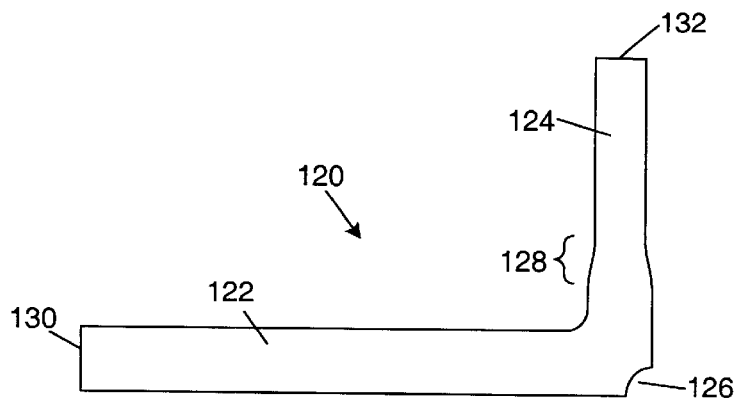 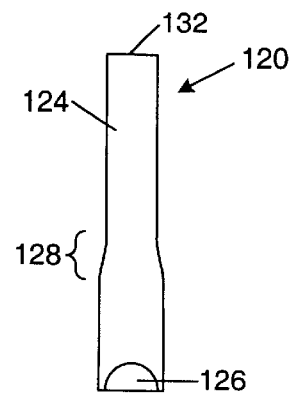
Fig. 8(a)  Fig. 8(b)
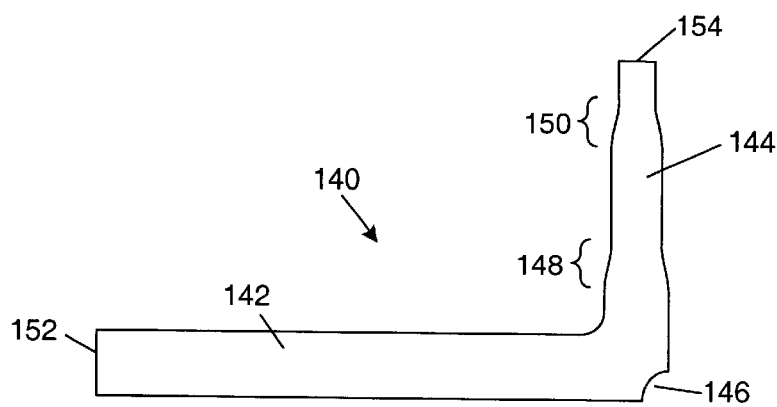 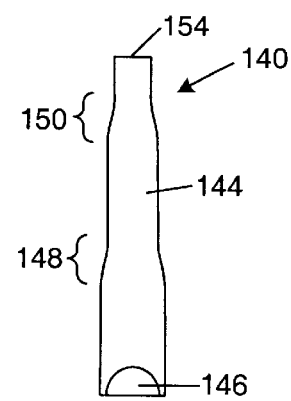
Fig. 9(a)  Fig. 9(b)

MULTI-PORT GAS INJECTOR FOR A VERTICAL FURNACE USED IN SEMICONDUCTOR PROCESSING

BACKGROUND OF THE INVENTION

1. Field of the Invention

This invention relates to semiconductor processing and, more particularly, to a multi-port gas injector for a vertical furnace utilized for low-pressure chemical-vapor-deposition of silicon dioxide from a tetraethyl orthosilicate ("TEOS") source.

2. Description of the Relevant Art

Fabrication of integrated circuits upon semiconductor substrates ("wafers") involves numerous processing steps. For example, the fabrication of a metal-oxide-semiconductor ("MOS") integrated circuit includes the formation of trench isolation structures within a semiconductor substrate to separate each MOS field-effect transistor ("MOSFET") that will be made. The semiconductor substrate is typically doped with either n-type or p-type impurities. A gate dielectric, typically composed of silicon dioxide, is formed on the semiconductor substrate. For each MOSFET being made, a gate conductor is formed over the gate dielectric and a source and drain are formed by introducing dopant impurities into the semiconductor substrate. Conductive interconnect lines are then formed to connect the MOSFETs to each other and to the terminals of the completed integrated circuit. Modern high-density integrated circuits typically include multiple interconnect levels to provide all of the necessary connections. Multiple interconnect levels are stacked on top of each other with intervening dielectric levels providing electrical insulation between interconnect levels.

One common processing step in integrated circuit fabrication is chemical vapor deposition ("CVD") that is utilized to deposit thin films on the upper surfaces of semiconductor substrates. The CVD process involves introducing reactant gases into a reaction chamber and then decomposing and reacting the gases at a heated surface of a semiconductor substrate to form a thin film. Typical films deposited by CVD include polysilicon, silicon dioxide, silicon nitride, and silicon oxynitride. For example, CVD may be used to deposit silicon dioxide to fill trench isolation structures, which may subsequently be polished by chemical-mechanical polishing to remove silicon dioxide external to the trenches, or to deposit polysilicon, which may be subsequently patterned to form gate electrodes.

A variety of different CVD techniques have been developed. All CVD techniques strive to optimize a variety of parameters including uniformity of film thickness, particulate generation, and throughput. Film thickness uniformity becomes increasingly important as the minimum feature size of devices formed on the semiconductor substrate continues to be reduced. Films of better thickness uniformity require less additional processing steps to planarize thereby reducing manufacturing costs. It is also desired to reduce the quantity of particles generated by CVD since such particles have the potential to destroy the integrated circuit being formed. Additionally, higher throughput decreases manufacturing costs by reducing the quantity of CVD reactors required to process a given number of wafers in a fixed period of time.

One popular form of CVD is low-pressure CVD ("LPCVD") in which the pressure of the reactant gases is much less than atmospheric pressure. LPCVD is capable of producing films with good thickness uniformity. Since LPCVD operates at low pressure, gas-phase reactions of the reactant gases are reduced thereby reducing particulate formation. Since the rate at which a film is deposited by LPCVD tends to be limited by the reaction rate of reactant gases at the semiconductor surface (as opposed to being limited by the mass transfer rate of reactant gases to the semiconductor substrate surface), LPCVD reactors may be optimized to process large quantities of semiconductor substrates simultaneously.

In semiconductor fabrication, silicon dioxide is frequently deposited using LPCVD from a TEOS source. FIG. 1 shows a side-view cross-sectional schematic of a vertical furnace that may be used for LPCVD of silicon dioxide using a TEOS source. An example of a vertical furnace is the Alpha-8S manufactured by Tokyo Electron Limited of Tokyo, Japan. Vertical furnace 10 holds a plurality of semiconductor substrates 12 within boat 14. Boat 14 may hold greater than 150 semiconductor substrates. Boat 14 is arranged upon pedestal 22 that is adapted to rotate boat 14 during deposition of silicon dioxide. Tube 18 defines a reaction chamber and liner 16 is arranged between boat 14 and tube 18. Boat 14, liner 16, tube 18, and pedestal 22 are typically made of quartz. Thermal insulating cover 20 surrounds tube 18 and heating elements (not shown) on an inner surface of cover 20 provide heat to the interior of vertical furnace 10. Liner 16, tube 18, cover 20, and pedestal 22 are mounted on base 24 that is composed of a heat-resistant material such as stainless steel. Gas injectors 26 and 28 are connected to base 24 by feedthroughs 30. Gas injectors 26 and 28 are adapted to introduce the reactant gases of TEOS and $O_2$, respectively, within liner 16. Gas injectors 26 and 28 are simple cylindrical tubes typically composed of quartz. Exhaust conduit 32 is adapted to evacuate tube 18 and to remove used reactant gases from tube 18. Exhaust conduit 32 is typically connected to a vacuum pump and adjustment of the pumping speed of gases through exhaust conduit 32 allows the pressure within the reaction chamber to be set.

Deposition of silicon dioxide begins by placing a plurality of semiconductor substrates 12 into boat 14 and placing boat 14 within tube 18. The interior of vertical furnace 10 is heated and tube 18 is evacuated through exhaust conduit 32. While boat 14 and pedestal 22 rotate, TEOS and $O_2$ gases are introduced through gas injectors 26 and 28. Liner 16 is used to contain the reactant gases in close proximity to semiconductor substrates 12 and also constrains the gas to flow up the vertical furnace to the top of tube 18. Boat 14 has an open structure that allows the reactant gas to also flow over the surfaces of semiconductor substrates 12. The TEOS gas thermally decomposes at the surfaces of semiconductor substrates 12 resulting in silicon dioxide being deposited on the surfaces of semiconductor substrates 12. Once the gas reaches the top of tube 18, it flows back down between liner 16 and tube 18 and subsequently exits through exhaust conduit 32. Typical operating parameters include flow rates of 190 sccm of TEOS and 5 sccm of $O_2$, a temperature in the reaction chamber of 680° C., and a pressure within the reaction chamber of 500 mTorr.

The thickness uniformity of silicon dioxide deposited with LPCVD from a TEOS source is dependent on the gas flow dynamics of the TEOS gas. The uniformity of the deposited silicon dioxide is also dependent upon the placement of semiconductor substrate 12 in boat 14. For example, FIGS. 2 and 3 show cross-sectional views of a silicon dioxide layer deposited on semiconductor substrates near the top and bottom of boat 14, respectively. As can be seen, silicon dioxide layer 34 deposited on semiconductor substrate 12 typically exhibits a convex shape when deposited at the top of boat 14 (FIG. 2) and a concave shape when deposited at the bottom of boat 14 (FIG. 3). At some point near the bottom of boat 14, the shape of the deposited silicon dioxide layer 34 will make a transition between these two shapes.

Typically, the locations in boat 14 that exhibit the worst thickness uniformity are the top and very bottom positions. To help improve the overall uniformity of the deposited silicon dioxide, these positions are typically not used. If boat 14 can hold 170 wafers, only the middle 150 positions, for example, may be filled with product wafers (i.e., wafers on which functional circuits are being fabricated) during deposition. The top 10 positions and bottom 10 positions may then be filled with dummy wafers (i.e., wafers on which functional circuits are not being fabricated). The dummy wafers are used to fill out boat 14 so that the geometry inside the vertical furnace is not changed. By doing this, the positions in boat 14 that produce the worst thickness uniformity are not used. The thickness uniformity of the deposited silicon dioxide still varies, however, and the best uniformity tends to be observed near the middle of boat 14. If the thickness uniformity of the deposited silicon dioxide could be further improved, less planarization of the silicon dioxide layer would be required thereby reducing the number of manufacturing steps required and reducing manufacturing costs.

It is therefore desired to improve the thickness uniformity of silicon dioxide layers deposited in a vertical furnace by LPCVD from a TEOS source. It is also desired that any improvements to the thickness uniformity be made without major modification to either the physical configuration of the vertical furnace or to the operating parameter used during deposition thereby minimizing the costs associated with the improvements. It is additionally desired that improvements to the thickness uniformity are such that more product wafers may be placed in the vertical furnace simultaneously or, in other words, that product wafers can be placed closer to the ends of the boat and still achieve adequate thickness uniformity. It is also desired that improving the thickness uniformity does not deleteriously increase the quantity of particles generated.

SUMMARY OF THE INVENTION

The problems outlined above are in large part addressed by a multi-port gas injector. The various embodiments of the multi-port gas injector contemplated herein have two or three ports for introducing TEOS into the vertical furnace. The multi-port injector is constructed such that the old single-port gas injector may be replaced by a new multi-port gas injector without requiring any other modifications of the vertical furnace. The vertical furnace can therefore be modified to use the multi-port gas injector with only minimal expense. Additionally, no modifications are required of the processing parameters for deposition of silicon dioxide thereby avoiding a need to develop new processing parameters for the vertical furnace when the multi-port gas injector is installed.

It is believed that the multi-port gas injector described herein advantageously improve the gas dynamics associated with the flow of TEOS through the vertical furnace resulting in improvements to the thickness uniformity of the deposited silicon dioxide. Utilization of the multi-port gas injector has resulted in improvements in thickness uniformity by as much as 50%. Semiconductor substrates possessing silicon dioxide layers having this improved thickness uniformity may require fewer planarization steps advantageously reducing the amount of processing required and therefore reducing manufacturing costs. Additionally, the multi-port gas injector may allow more of the vertical furnace's boat to be used by process wafers. Increasing the number of process wafers on which silicon dioxide may be simultaneously deposited results in increased throughput of the vertical furnace and reduced manufacturing cost. The multi-port gas injector is also not observed to increase the quantity of particles generated during LPCVD.

At least six different embodiments of the multi-port gas injector are contemplated herein. All the embodiments have either two or three ports for introducing TEOS into the vertical furnace. All the embodiments include a first and second section of tubing preferably joined at approximately right angles to one another such that TEOS exiting from the second section of tubing is directed along a length of the liner of the vertical furnace. The first and second sections may be joined at other angles, however, TEOS exiting the second section of tubing is still directed along a length of the liner. All embodiments of the multi-port gas injector are preferably made from quartz. Other materials compatible with the environment inside the vertical furnace may be used though. Examples of other suitable materials include silicon carbide and stainless steel.

A first embodiment of the multi-port gas injector includes a third section of tubing joined to the second section of tubing. The third section is preferably substantially perpendicular to both the first and second sections of tubing; however, the third section of tubing may be angled such that it is substantially perpendicular to only the first or second section of tubing or to neither section of tubing. This embodiment therefore has two ports for introducing TEOS into the vertical furnace in which the two ports are the second and third sections of tubing. The first and second sections of tubing preferably have approximately the same diameter while the third section preferably has a smaller diameter.

A second embodiment has the same three sections of tubing as the first embodiment, however, the second section of tubing includes a taper. A diameter of the second section decreases along a portion of the second section between the position at which the third section is joined and the end of the second section not joined to the first section. The diameter of the second section at the end not joined to the first section is preferably approximately equal to the diameter of the third section. If the flow rate of gas is kept constant, tapering the diameter of the second section increases the pressure within the gas injector thereby increasing the velocity gas leaves the ports of the injector and increasing the quantity of gas exiting the third section relative to the quantity of gas exiting the second section. This increased velocity at which gas exit the second section of tubing is believed to distribute more gas further along the liner of the vertical furnace.

A third embodiment has the same three sections of tubing as the first embodiment and has a fourth section of tubing joined to the second section of tubing. Alternatively, the third and fourth sections of tubing are preferably substantially colinear. The third and fourth sections of tubing may be angled such that they are substantially perpendicular to only the first or second section of tubing or to neither the first nor second section. This embodiment therefore has three ports for introducing TEOS into the vertical furnace in which the three ports are the second, third, and fourth sections of tubing. The diameter of the fourth section of tubing is preferably approximately equal to the diameter of the third section of tubing.

A fourth embodiment has the same four sections of tubing as the third embodiment, however, the second section of tubing includes a taper in a similar location as that of the second embodiment. The diameter of the second section at the end not joined to the first section is preferably approximately equal to the diameter of the third section.

A fifth embodiment includes a hole located at a position where the first and second sections are joined and the second section of tubing includes a taper. A diameter of the second section decreases along a portion of the second section near the position where the first and second sections are joined. This embodiment therefore has two ports for introducing TEOS into the vertical furnace in which the two ports are the second section of tubing and the hole. A diameter of the second section at the position it joins the first section is approximately equal to a diameter of the first section The diameter of the hole may be either approximately equal to or less than the diameter of the first section of tubing.

A sixth embodiment includes the first and second section, the hole, and the taper of the fifth embodiment, however, the second section of tubing includes a second taper. A diameter of the second section decreases along a portion of the second section near the end of the second section not joined to the first section. This embodiment therefore has two ports for introducing TEOS into the vertical furnace in which the two ports are the second section of tubing and the hole. The tapers are believed to advantageously distribute the gas further along the liner of the vertical furnace as discussed in regards to the second embodiment.

Additionally, a vertical furnace incorporating the multi-port gas injector is also contemplated herein. The vertical furnace includes a quartz boat that holds a plurality of semiconductor substrates. The boat is arranged upon a quartz pedestal that is adapted to rotate. A quartz tube defines a reaction chamber. A quartz liner is arranged between the tube and the boat. A thermal insulating cover surrounds the tube. The tube, liner, pedestal, and cover are mounted on a base. A multi-port gas injector is adapted to introduce TEOS into the liner while a single-port gas injector is adapted to introduce $O_2$ into the liner. An exhaust conduit is used to evacuate the tube and remove used reactant gases.

BRIEF DESCRIPTION OF THE DRAWINGS

Other objects and advantages of the invention will become apparent upon reading the following detailed description and upon reference to the accompanying drawings in which:

FIGS. 6(a) and (b) are two different side views of a multi-port gas injector according to a third embodiment;

FIGS. 7(a) and (b) are two different side views of a multi-port gas injector according to a fourth embodiment;

FIGS. 8(a) and (b) are two different side views of a multi-port gas injector according to a fifth embodiment;

FIGS. 9(a) and (b) are two different side view of a multi-port gas injector according to a sixth embodiment.

Figure 1:
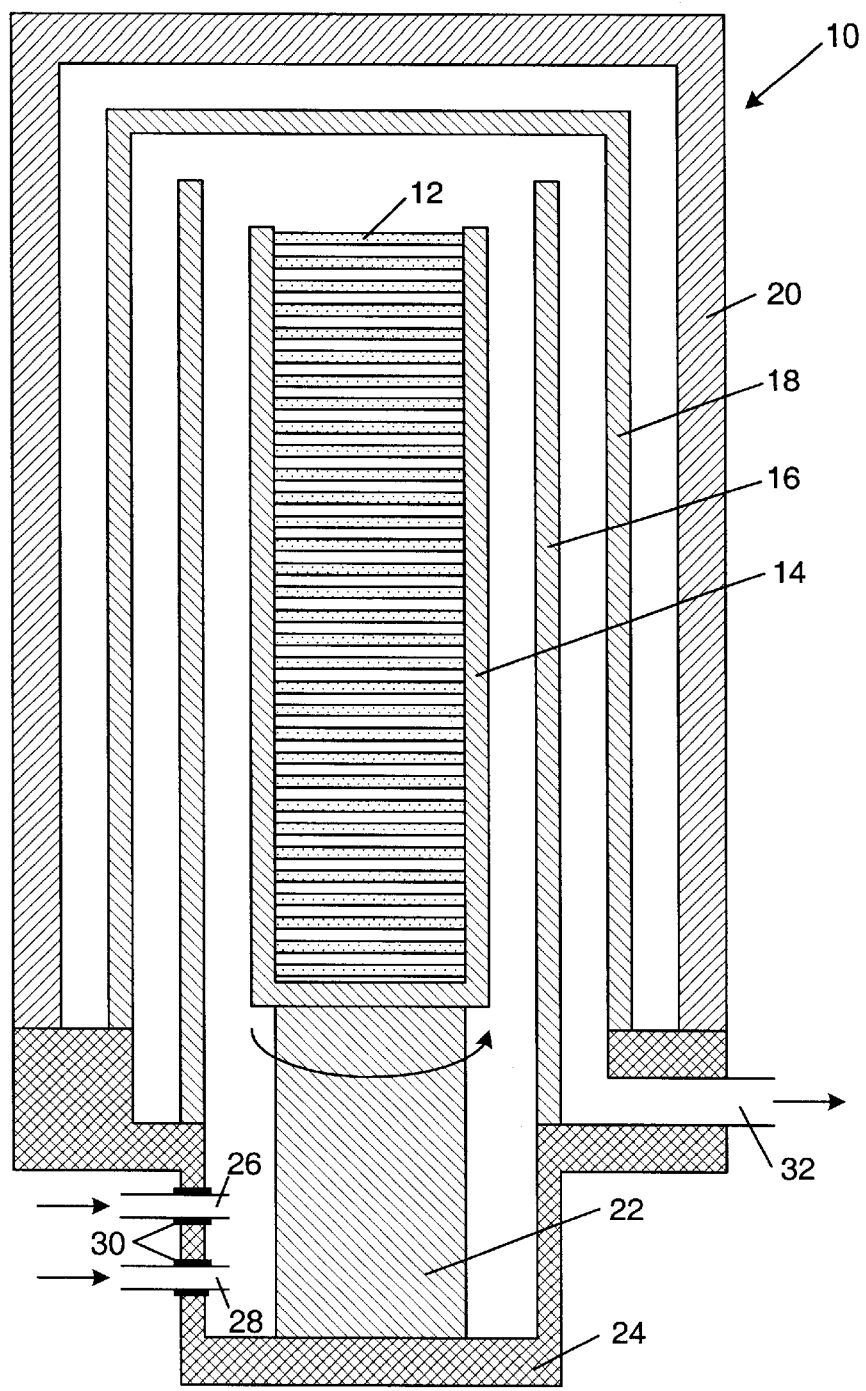
FIG. 1 is a cross-sectional side-view schematic of a vertical furnace used for LPCVD of silicon dioxide from a TEOS source.
Figure 2:
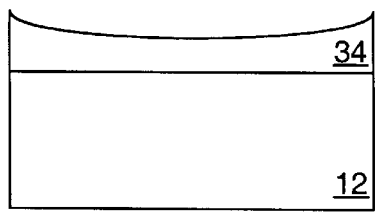
FIG. 2 is a cross-sectional side view of a semiconductor topography on which silicon dioxide has been deposited near the top of a vertical furnace.
Figure 3:
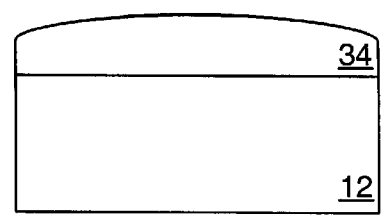
FIG. 3 is a cross-sectional side view of a semiconductor topography on which silicon dioxide has been deposited near the bottom of a vertical furnace.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 4A:
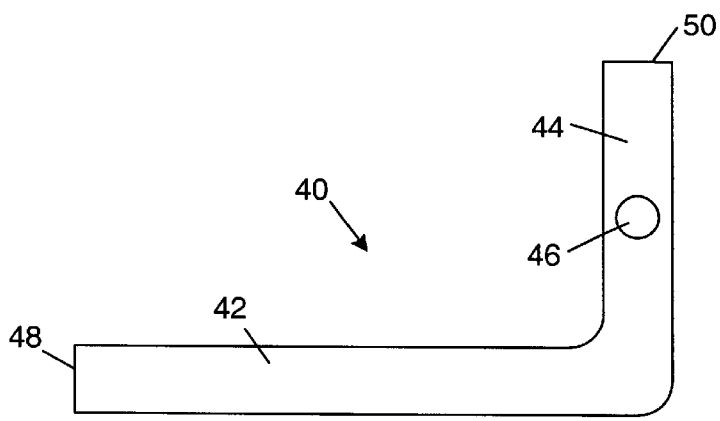
FIGS. 4(a) and (b) are two different side views of a multi-port gas injector according to a first embodiment.

Turning now to the drawings, FIGS. 4(a) and (b) show two different side views of a multi-port gas injector according to a first embodiment. Multi-port gas injector 40 includes sections 42, 44, and 46 of tubing. For this and all other embodiments recited herein, a preferred material for the tubing is quartz and the multi-port gas injectors may be made using standard glass manufacturing techniques. However, any material, such as silicon carbide or stainless steel, that is compatible with the environment inside the vertical furnace may be used for making the tubing. Section 42 is joined to section 44 such that the two sections are preferably substantially perpendicular. Section 46 is joined to section 44 such that section 46 is preferably substantially perpendicular to both section 42 and section 44. To alter the flow dynamics of the TEOS, section 46 may alternatively be angled such that it is substantially perpendicular to only section 42 or section 44 or to neither section 42 nor section 44. A diameter of section 42 is preferably approximately equal to a diameter of section 44 and a diameter of section 46 is preferably less than a diameter of section 44. End 48 of injector 40 may be adapted to receive gas from a TEOS source. The gas may then flow through injector 40 and exit through ends 50 and 52.

Figure 5A:
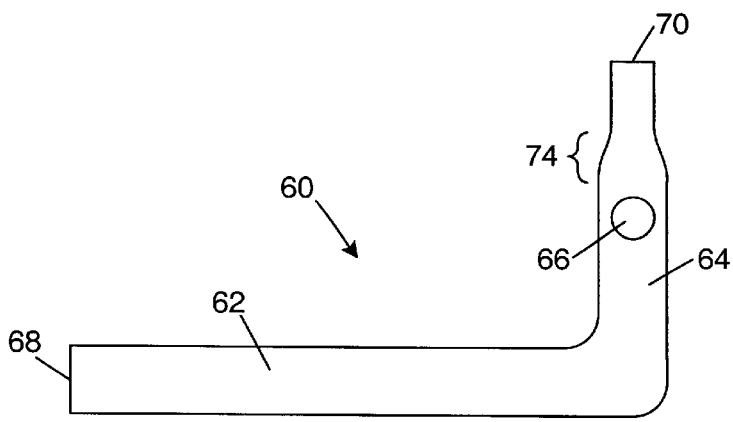
FIGS. 5(a) and (b) are two different side views of a multi-port gas injector according to a second embodiment.
Figure 5B:
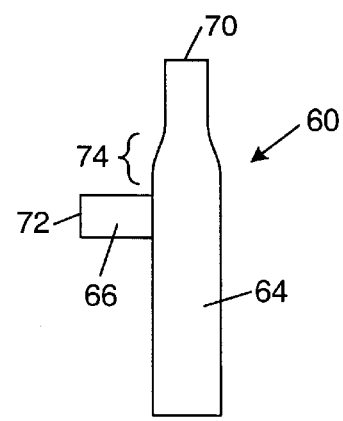

FIGS. 5(a) and (b) depict two different side views of a multi-port gas injector according to a second embodiment. Multi-port gas injector 60 includes sections 62, 64, and 68 of tubing. Injector 60 is similar to injector 40 except that a portion of section 64 is tapered. Section 62 is joined to section 64 such that the two sections are preferably substantially perpendicular. Section 66 is joined to section 64 such that section 66 is preferably substantially perpendicular to both section 62 and section 64. Alternatively, section 66 may be angled such that it is substantially perpendicular to only section 62 or section 64 or to neither section 62 nor section 64. A diameter of a portion of section 64 adjacent to section 62 is preferably approximately equal to a diameter of section 62. A diameter of section 64 decreases in region 74. A diameter of section 64 at end 70 is preferably approximately equal to a diameter of section 66. End 68 of injector 60 may be adapted to receive gas from a TEOS source. The gas may then flow through injector 60 and exit through ends 70 and 72.

FIGS. 6(a) and (b) illustrate two different side views of a multi-port gas injector according to a third embodiment. Multi-port gas injector 80 includes sections 82, 84, 86, and 88 of tubing. Section 82 is joined to section 84 such that the two sections are preferably substantially perpendicular. Section 86 is joined to section 84 such that section 86 is preferably substantially perpendicular to both section 82 and section 84. Section 88 is joined to section 84 such that section 88 is preferably substantially colinear to section 86. Alternatively, sections 86 and 88 may be angled such that they are substantially perpendicular to only section 82 or section 84 or to neither section 82 nor section 84. A diameter of section 82 is preferably approximately equal to a diameter of section 84, a diameter of section 86 is preferably approximately equal to a diameter of section 88, and the diameters of sections 86 and 88 are preferably less than the diameter of section 84. End 90 of injector 80 may be adapted to receive gas from a TEOS source. The gas may then flow through injector 80 and exit through ends 92, 94, and 96.

FIGS. 7(a) and (b) show two different side views of a multi-port gas injector according to a fourth embodiment. Multi-port gas injector 100 includes sections 102, 104, 106, and 108 of tubing. Injector 100 is similar to injector 80 except that a portion of section 104 is tapered. Section 102 is joined to section 104 such that the two sections are preferably substantially perpendicular. Section 106 is joined to section 104 such that section 106 is preferably substantially perpendicular to both section 102 and section 104. Section 108 is joined to section 104 such that section 108 is preferably substantially colinear to section 106. Alternatively, sections 106 and 108 may be angled such that they are substantially perpendicular to only section 102 or section 104 or to neither section 102 nor section 104. A diameter of a portion of section 104 adjacent to section 102 is preferably approximately equal to a diameter of section 102. A diameter of section 104 decreases in region 118. A diameter of section 104 at end 112 is preferably approximately equal to diameters of sections 106 and 108. The diameter of section 106 is preferably approximately equal to the diameter of section 108. End 110 of injector 100 may be adapted to receive gas from a TEOS source. The gas may then flow through injector 100 and exit through ends 112, 114, and 116.

Utilization of gas injector 100 for LPCVD of silicon dioxide in a vertical furnace using a TEOS source shows the greatest improvements in thickness uniformity of the silicon dioxide layer. Improvements in thickness uniformity by as much as 50% are observed when this injector is utilized, however, utilization of all embodiments of the multi-port gas injector described herein may result in improvements in thickness uniformity.

FIGS. 8(a) and (b) depicts two different side views of a multi-port gas injector according to a fifth embodiment. Multi-port gas injector 120 includes sections 122 and 124 of tubing in which a portion of section 124 is tapered. Section 122 is joined to section 124 such that the two sections are preferably substantially perpendicular. A diameter of a portion of section 124 adjacent to section 122 is preferably approximately equal to a diameter of section 122. A diameter of section 124 decreases in region 128. Hole 126 is located at a position where section 122 is joined to section 124. A diameter of hole 126 may be approximately equal to or less than the diameter of section 122. End 130 of injector 120 may be adapted to receive gas from a TEOS source. The gas may then flow through injector 120 and exit through end 132 and hole 126.

FIGS. 9(a) and (b) show two different side views of a multi-port gas injector according to a sixth embodiment. Multi-port gas injector 140 includes sections 142 and 144 of tubing. Injector 140 is similar to injector 120 except that a portion of section 144 includes an additional taper. Section 142 is joined to section 144 such that the two sections are preferably substantially perpendicular. A diameter of a portion of section 144 adjacent to section 142 is preferably approximately equal to a diameter of section 142. A diameter of section 144 decreases in region 148 and decreases again in region 150. Hole 146 is located at a position where section 142 is joined to section 144. A diameter of hole 146 may be approximately equal to or less than the diameter of section 142. End 152 of injector 140 may be adapted to receive gas from a TEOS source. The gas may then flow through injector 140 and exit through end 154 and hole 146.

Figure 4B:
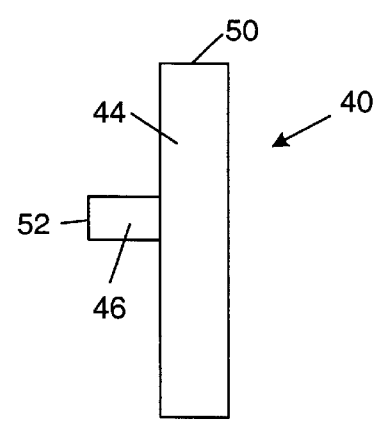
Figure 10:
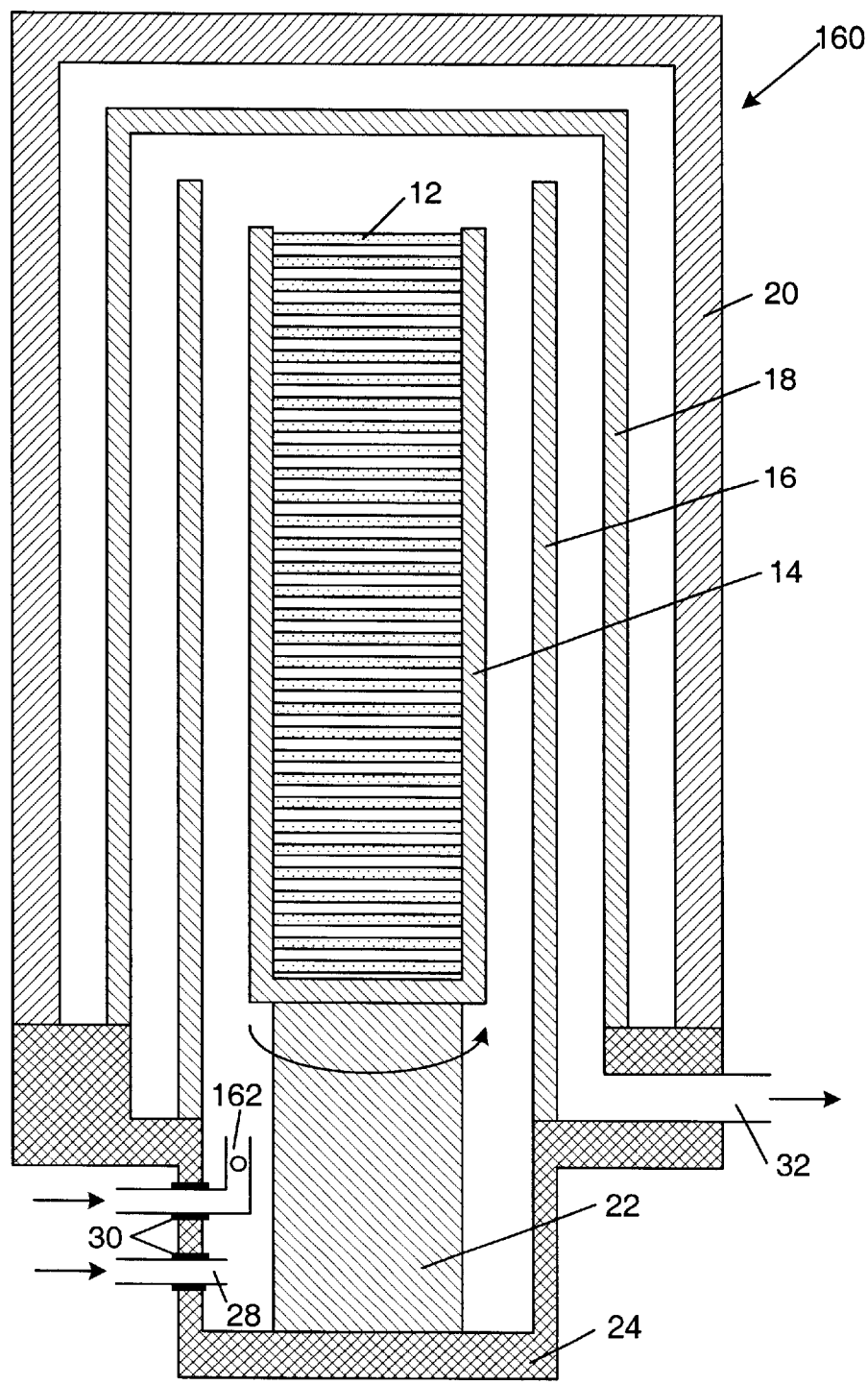
FIG. 10 is a cross-sectional side-view schematic of a vertical furnace used for LPCVD of silicon dioxide from a TEOS source showing the orientation of a multi-port gas injector.

FIG. 10 illustrates a cross-section side-view schematic of a vertical furnace that may be utilized for LPCVD of silicon dioxide from a TEOS source and shows the orientation of a multi-port gas injector within the vertical furnace. Only those portions of vertical furnace 160 shown in FIG. 10 different from vertical furnace 10 shown in FIG. 1 will be described here. Multi-port gas injector 162 is adapted for introducing TEOS into liner 16. The first embodiment, which is depicted in FIG. 4, of the multi-port gas injector is shown being utilized; however, any of the embodiments described herein may be used. Any embodiment of the multi-port gas injector will be oriented such that gas exiting the second section will flow directly along a length of liner 16. Improvements in thickness uniformity of the deposited silicon dioxide layer observed when a multi-port gas injector is utilized are believed to result from improvements in the gas dynamics of the TEOS flow within the vertical furnace. Gas injector 28 is adapted for introducing $O_2$ into liner 16 and remains a standard single-port gas injector. The only modification made to vertical furnace 160 is the replacement of a single-port gas injector for TEOS with multi-port gas injector 162. Additionally, no changes to process parameters need be made. Therefore, the improvements in thickness uniformity are gained for minimal expense.

It will be appreciated to those skilled in the art having the benefit of this disclosure that this invention is believed to provide a multi-port gas injector for a vertical furnace. Further modifications and alternative embodiments of various aspects of the invention will be apparent to those skilled in the art in view of this description. It is intended that the following claims are interpreted to embrace all such modifications and changes and, accordingly, the specification and drawings are to be regarded in an illustrative rather than a restrictive sense.

What is claimed is:

1. A gas injector for a vertical furnace used for low-pressure chemical vapor deposition of silicon dioxide from a TEOS source, comprising:
    a first section of tubing;
    a second substantially straight section of tubing, wherein the second section is joined to the first section such that the first and second sections are substantially perpendicular; and
    a third section of tubing, wherein the third section is joined to the second section at a position laterally displaced between ends of the second section.

2. The gas injector of claim 1, wherein the gas injector comprises quartz.

3. The gas injector of claim 1, wherein the first, second, and third sections have inner diameters that accommodates a gas flow therebetween.

4. The gas injector of claim 1, wherein the third section is substantially perpendicular to a plane containing both the first and second sections.

5. The gas injector of claim 1, wherein a diameter of the first section is approximately equal to a diameter of the second section, and wherein the diameter of the second section is greater than a diameter of the third section.

6. The gas injector of claim 1, wherein a diameter of the second section decreases along a portion of the second section between the position at which the third section is joined and the end of the second section not joined to the first section.

7. The gas injector of claim 6, wherein the diameter of the second section at the end of the second section not joined to the first section is approximately equal to a diameter of the third section.

8. The gas injector of claim 1, further comprising a fourth section of tubing, wherein the fourth section is joined to the second section at a position laterally displaced between ends of the second section.

9. The gas injector of claim 8, wherein the fourth section is substantially colinear with the third section.

10. The gas injector of claim 8, wherein a diameter of the first section is approximately equal to a diameter of the second section, a diameter of the third section is approximately equal to a diameter of the fourth section, and the diameter of the second section is greater than the diameter of the fourth section.

11. The gas injector of claim 8, wherein a diameter of the second section decreases along a portion of the second section between the position at which the fourth section is joined and the end of the second section not joined to the first section.

12. The gas injector of claim 11, wherein the diameter of the second section at the end of the second section not joined to the first section is approximately equal to a diameter of the fourth section.

13. A gas injector for a vertical furnace used for low-pressure chemical vapor deposition of silicon dioxide from a TEOS source, comprising:
   a first section of tubing;
   a second section of tubing, wherein the second section is joined to the first section such that the first and second sections are substantially perpendicular; and
   a hole located at a position where the first section is joined to the second section.

14. The gas injector of claim 13, wherein the gas injector comprises quartz.

15. The gas injector of claim 13, wherein the first and second sections have inner diameters that accommodates a gas flow therebetween.

16. The gas injector of claim 13, wherein a diameter of the second section decreases along a portion of the second section adjacent to the end of the second section joined to the first section.

17. The injector of claim 16, wherein the diameter of the second section decreases along a portion of the second adjacent to the end of the second section not joined to the first section.

18. The gas injector of claim 13, wherein a diameter of the hole is approximately equal to a diameter of the first section.

19. The gas injector of claim 13, wherein a diameter of the hole is less than a diameter of the first section.

20. A vertical furnace for low-pressure chemical vapor deposition of silicon dioxide using a TEOS source, comprising:
   a quartz tube;
   a quartz liner arranged within the quartz tube;
   a quartz boat arranged within the quartz liner adapted for holding a plurality of semiconductor substrates; and
   a first gas injector adapted for introducing TEOS into the vertical furnace and arranged at an end of the quartz liner, wherein the first gas injector comprises:
   a first section of tubing;
   a second section of tubing, wherein the first and second sections are substantially perpendicular; and
   a hole positioned where the first section is joined to the second section.

21. The vertical furnace of claim 20, wherein the first gas injector comprises quartz.

22. The vertical furnace of claim 20, wherein the first gas injector is arranged such that the TEOS exiting the second section of tubing flows directly into the quartz liner.

23. The vertical furnace of claim 20, wherein the first and second sections have inner diameters that accommodates a gas flow therebetween.

24. The vertical furnace of claim 20, wherein a diameter of the second section decreases along at least one portion of the second section.

25. A vertical furnace for low-pressure chemical vapor deposition of silicon dioxide using a TEOS source, comprising:
   a quartz tube;
   a quartz liner arranged within the quartz tube;
   a quartz boat arranged within the quartz liner adapted for holding a plurality of semiconductor substrates; and
   a first gas injector adapted for introducing TEOS into the vertical furnace and arranged at an end of the quartz liner, wherein the first gas injector comprises:
   a first section of tubing;
   a second section of tubing, wherein the first and second sections are substantially perpendicular; and
   a third section of tubing, wherein the third section is joined to the second section at a position laterally displaced between ends of the second section, and wherein the third section is substantially perpendicular to a plane containing both the first and second sections.

26. The vertical furnace of claim 25, wherein a diameter of the second section decreases along a portion of the second section between the position at which the third section is joined and the end of the second section not joined to the first section.

27. The vertical furnace of claim 25, wherein the first gas injector further comprises a fourth section of tubing, wherein the fourth section is joined to the second section at a position such that the fourth section is substantially colinear with the third section.

28. The vertical furnace of claim 27, wherein a diameter of the second section decreases along a portion of the second section between the position at which the fourth section is joined and the end of the second section not joined to the first section.

29. The vertical furnace of claim 20, further comprising a second gas injector adapted for introducing oxygen into the vertical furnace and arranged at the same end of the quartz liner as the first gas injector, wherein the second gas injector comprises a straight section of tubing.

* * * * *

UNITED STATES PATENT AND TRADEMARK OFFICE
CERTIFICATE OF CORRECTION

PATENT NO. : 6,296,710 B1  
DATED : October 2, 2001  
INVENTOR(S) : Allen et al.

It is certified that error appears in the above-identified patent and that said Letters Patent is hereby corrected as shown below:

Title page,
Item [75] please delete Richard A. Anundson and substitute therefor -- Richard T. Anundson --.

Signed and Sealed this

Fifth Day of March, 2002

Attest:

Attesting Officer

JAMES E. ROGAN  
Director of the United States Patent and Trademark Office